(12) United States Patent
Meade et al.

(10) Patent No.: US 7,906,982 B1
(45) Date of Patent: Mar. 15, 2011

(54) INTERFACE APPARATUS AND METHODS OF TESTING INTEGRATED CIRCUITS USING THE SAME

(75) Inventors: Richard Meade, San Francisco, CA (US); Sherif Eid, Sunnyvale, CA (US); Lance Stevens, Burnsville, MN (US); Miroslav Slanina, Sunnyvale, CA (US)

(73) Assignee: Cypress Semiconductor Corporation, San Jose, CA (US)

( * ) Notice: Subject to any disclaimer, the term of this patent is extended or adjusted under 35 U.S.C. 154(b) by 0 days.

(21) Appl. No.: 11/711,382

(22) Filed: Feb. 27, 2007

Related U.S. Application Data

(60) Provisional application No. 60/777,584, filed on Feb. 28, 2006.

(51) Int. Cl.
*G01R 31/26* (2006.01)
(52) U.S. Cl. .............. 324/765; 324/754; 324/158.1
(58) Field of Classification Search .......... 324/754–765, 324/158.1; 703/23
See application file for complete search history.

(56) References Cited

U.S. PATENT DOCUMENTS

| | | | |
|---|---|---|---|
| 3,789,360 A | 1/1974 | Clark et al. |
| 3,800,090 A | 3/1974 | Matena |
| 3,810,120 A | 5/1974 | Huettner et al. |
| 3,833,888 A | 9/1974 | Stafford et al. |
| 3,864,670 A | 2/1975 | Inoue et al. |
| 3,873,818 A | 3/1975 | Barnard |
| 4,038,533 A | 7/1977 | Dummermith |
| 4,042,972 A | 8/1977 | Gruner et al. |
| 4,195,351 A | 3/1980 | Barner et al. |
| 4,357,703 A | 11/1982 | Van Brunt |
| 4,466,055 A | 8/1984 | Kinoshita et al. |
| 4,481,625 A | 11/1984 | Roberts et al. |
| 4,496,985 A | 1/1985 | Jensen et al. |
| 4,509,008 A | 4/1985 | DasGupta et al. |
| 4,511,968 A | 4/1985 | Fenesik et al. |
| 4,525,802 A | 6/1985 | Hackamack |
| RE32,326 E | 1/1987 | Nagel et al. |

(Continued)

FOREIGN PATENT DOCUMENTS

JP 04122141 A1 4/1992

(Continued)

OTHER PUBLICATIONS

USPTO Notice of Allowance for U.S. Appl. No. 10/125,117 dated Jul. 29, 2004; 5 pages.

(Continued)

*Primary Examiner* — Ha Tran T Nguyen
*Assistant Examiner* — Richard Isla Rodas

(57) ABSTRACT

An apparatus and method are provided for testing a semiconductor device (DUT). Generally, the apparatus includes an interface board with conductive elements adapted to electrically couple with the DUT and connected to a number of test circuits. Each test circuit resides on one of a number of daughter cards on the interface board, and provides test input signals to and receives output signals from the DUT to generate a result based on a program loaded to the daughter cards before testing begins. The apparatus further includes a controller to drive the interface board and store test results. In one embodiment, the interface board is a load board for back end testing. In another embodiment, the interface board is a probe card for front end testing. Preferably, the apparatus is capable of testing DUTs including memory arrays, logic circuits or both, and the daughter cards are capable of being re-programmed and re-used on different DUTs.

19 Claims, 3 Drawing Sheets

U.S. PATENT DOCUMENTS

| | | |
|---|---|---|
| 4,775,976 A | 10/1988 | Yokoyama |
| 4,807,147 A | 2/1989 | Halbert et al. |
| 4,823,363 A | 4/1989 | Yoshida |
| 4,890,102 A | 12/1989 | Oliver |
| 4,901,259 A | 2/1990 | Watkins |
| 4,961,053 A | 10/1990 | Krug |
| 5,049,814 A | 9/1991 | Walker et al. |
| 5,061,033 A | 10/1991 | Richard |
| 5,072,175 A | 12/1991 | Marek |
| 5,177,630 A | 1/1993 | Goutzoulis et al. |
| 5,218,684 A | 6/1993 | Hayes et al. |
| 5,282,166 A | 1/1994 | Ozaki |
| 5,289,116 A | 2/1994 | Kurita et al. |
| 5,295,079 A | 3/1994 | Weng et al. |
| 5,339,279 A | 8/1994 | Toms et al. |
| 5,345,109 A | 9/1994 | Mehta |
| 5,404,480 A | 4/1995 | Suzuki |
| 5,410,547 A | 4/1995 | Drain |
| 5,444,716 A | 8/1995 | Jarwala et al. |
| 5,471,524 A | 11/1995 | Colvin et al. |
| 5,475,624 A | 12/1995 | West |
| 5,477,160 A | 12/1995 | Love |
| 5,490,282 A | 2/1996 | Dreps et al. |
| 5,524,114 A | 6/1996 | Peng |
| 5,528,136 A | 6/1996 | Rogoff et al. |
| 5,543,707 A | 8/1996 | Yoneyama et al. |
| 5,566,296 A | 10/1996 | Ohmori et al. |
| 5,581,742 A | 12/1996 | Lin et al. |
| 5,583,874 A | 12/1996 | Smith et al. |
| 5,583,893 A | 12/1996 | Nguyen |
| 5,598,156 A | 1/1997 | Hush et al. |
| 5,604,888 A * | 2/1997 | Kiani-Shabestari et al. ... 703/23 |
| 5,606,567 A | 2/1997 | Agrawal et al. |
| 5,614,838 A | 3/1997 | Jaber et al. |
| 5,633,899 A | 5/1997 | Fiedler et al. |
| 5,636,163 A | 6/1997 | Furutani et al. |
| 5,673,276 A | 9/1997 | Jarwala et al. |
| 5,675,813 A | 10/1997 | Holmdahl |
| 5,740,086 A | 4/1998 | Komoto |
| 5,778,004 A | 7/1998 | Jennion et al. |
| 5,781,718 A | 7/1998 | Nguyen |
| 5,784,581 A | 7/1998 | Hannah |
| 5,807,767 A | 9/1998 | Stroupe |
| 5,844,856 A | 12/1998 | Taylor |
| 5,845,151 A | 12/1998 | Story et al. |
| 5,859,993 A | 1/1999 | Snyder |
| 5,867,436 A | 2/1999 | Furutani et al. |
| 5,875,132 A | 2/1999 | Ozaki |
| 5,887,050 A | 3/1999 | Fenske et al. |
| 5,889,936 A | 3/1999 | Chan |
| 5,896,534 A | 4/1999 | Pearce et al. |
| 5,920,483 A | 7/1999 | Greenwood et al. |
| 5,929,651 A | 7/1999 | Leas et al. |
| 5,930,168 A | 7/1999 | Roohparvar |
| 5,937,154 A | 8/1999 | Tegethoff |
| 5,942,911 A * | 8/1999 | Motika et al. ............... 324/769 |
| 5,946,472 A | 8/1999 | Graves et al. |
| 5,951,704 A | 9/1999 | Sauer et al. |
| 5,959,887 A | 9/1999 | Takashina et al. |
| 5,959,911 A | 9/1999 | Krause et al. |
| 5,969,986 A | 10/1999 | Wong et al. |
| 5,999,002 A | 12/1999 | Fasnacht et al. |
| 6,002,868 A | 12/1999 | Jenkins et al. |
| 6,023,428 A | 2/2000 | Tran |
| 6,028,439 A * | 2/2000 | Arkin et al. ............... 324/765 |
| 6,049,896 A | 4/2000 | Frank et al. |
| 6,064,213 A | 5/2000 | Khandros et al. |
| 6,069,494 A | 5/2000 | Ishikawa |
| 6,073,193 A | 6/2000 | Yap |
| 6,074,904 A | 6/2000 | Spikes |
| 6,075,373 A | 6/2000 | Iino |
| 6,084,215 A | 7/2000 | Furuya et al. |
| 6,128,242 A | 10/2000 | Banba et al. |
| 6,146,970 A | 11/2000 | Witek et al. |
| 6,148,354 A | 11/2000 | Ban et al. |
| 6,154,803 A | 11/2000 | Pontius et al. |
| 6,157,975 A | 12/2000 | Brief et al. |
| 6,189,109 B1 | 2/2001 | Sheikh et al. |
| 6,202,103 B1 | 3/2001 | Vonbank et al. |
| 6,208,947 B1 | 3/2001 | Beffa |
| 6,272,112 B1 | 8/2001 | Orita |
| 6,304,982 B1 | 10/2001 | Mongan et al. |
| 6,320,811 B1 | 11/2001 | Snyder et al. |
| 6,320,866 B2 | 11/2001 | Wolf et al. |
| 6,324,663 B1 | 11/2001 | Chambers |
| 6,330,241 B1 | 12/2001 | Fort |
| 6,343,260 B1 | 1/2002 | Chew |
| 6,345,373 B1 | 2/2002 | Chakradhar et al. |
| 6,360,271 B1 | 3/2002 | Schuster et al. |
| 6,363,085 B1 | 3/2002 | Samuels |
| 6,370,635 B2 | 4/2002 | Snyder |
| 6,393,588 B1 | 5/2002 | Hsu et al. |
| 6,400,173 B1 | 6/2002 | Shimizu et al. |
| 6,404,218 B1 | 6/2002 | Le et al. |
| 6,452,411 B1 | 9/2002 | Miller et al. |
| 6,483,330 B1 | 11/2002 | Kline |
| 6,509,213 B2 | 1/2003 | Noble |
| 6,527,563 B2 | 3/2003 | Clayton |
| 6,528,988 B2 * | 3/2003 | Bolda et al. ................ 324/202 |
| 6,531,335 B1 | 3/2003 | Grigg |
| 6,535,831 B1 | 3/2003 | Hudson et al. |
| 6,551,844 B1 | 4/2003 | Eldridge et al. |
| 6,559,666 B2 | 5/2003 | Bernier et al. |
| 6,563,173 B2 | 5/2003 | Bolam et al. |
| 6,571,357 B1 | 5/2003 | Martin et al. |
| 6,627,484 B1 | 9/2003 | Ang |
| 6,627,954 B1 | 9/2003 | Seefeldt |
| 6,703,852 B1 * | 3/2004 | Feltner .......................... 324/754 |
| 6,704,888 B1 | 3/2004 | Caudrelier et al. |
| 6,724,848 B1 | 4/2004 | Iyer |
| 6,727,723 B2 * | 4/2004 | Shimizu et al. ............... 324/765 |
| 6,734,693 B2 | 5/2004 | Nakayama |
| 6,735,720 B1 | 5/2004 | Dunn et al. |
| 6,753,238 B2 | 6/2004 | Kurita |
| 6,774,395 B1 | 8/2004 | Lin et al. |
| 6,825,052 B2 * | 11/2004 | Eldridge et al. ............... 438/15 |
| 6,825,683 B1 | 11/2004 | Berndt et al. |
| 6,849,928 B2 | 2/2005 | Cha et al. |
| 6,876,214 B2 * | 4/2005 | Crook et al. ................... 324/755 |
| 6,903,562 B1 * | 6/2005 | Smith et al. ................... 324/754 |
| 6,912,778 B2 | 7/2005 | Ahn et al. |
| 6,917,998 B1 * | 7/2005 | Giles ............................ 710/300 |
| 6,959,257 B1 | 10/2005 | Larky et al. |
| 6,975,130 B2 * | 12/2005 | Yevmenenko ................ 324/765 |
| 6,978,335 B2 | 12/2005 | Lee |
| 7,036,062 B2 | 4/2006 | Morris et al. |
| 7,102,367 B2 | 9/2006 | Yamagishi et al. |
| 7,112,975 B1 | 9/2006 | Jin et al. |
| 7,113,902 B2 | 9/2006 | Swobada |
| 7,138,811 B1 * | 11/2006 | Mahoney et al. ............. 324/754 |
| 7,245,134 B2 * | 7/2007 | Granicher et al. ............ 324/754 |
| 7,307,433 B2 * | 12/2007 | Miller et al. .................. 324/754 |
| 7,327,153 B2 * | 2/2008 | Weinraub ....................... 324/763 |
| 7,381,630 B2 | 6/2008 | Sawyer |
| 2003/0210031 A1 * | 11/2003 | Miller ....................... 324/158.1 |
| 2005/0110513 A1 * | 5/2005 | Osada et al. .................. 324/765 |
| 2005/0237073 A1 * | 10/2005 | Miller et al. .................. 324/754 |

FOREIGN PATENT DOCUMENTS

WO      WO 97/36230 A      10/1997

OTHER PUBLICATIONS

USPTO Non-Final Rejection for U.S. Appl. No. 10/125,117 dated Feb. 26, 2004; 5 pages.

USPTO Non-Final Rejection for U.S. Appl. No. 10/125,117 dated Aug. 29, 2003; 5 pages.

U.S. Appl. No. 10/125,117: "System and Method for Testing Multiple Integrated Circuits that are in the Same Package," Berndt et al.; 25 pages.

USPTO Notice of Allowance for U.S. Appl. No. 09/658,597 dated May 10, 2005; 14 pages.

USPTO Final Rejection for U.S. Appl. No. 09/658,597 dated Feb. 11, 2005; 21 pages.

USPTO Miscellaneous Action for U.S. Appl. No. 09/658,597 dated Oct. 23, 2004; 2 pages.

USPTO Non-Final Rejection for U.S. Appl. No. 09/658,597 dated Jul. 15, 2004; 13 pages.
USPTO Advisory Action for U.S. Appl. No. 09/658,597 dated Jan. 22, 2004; 3 pages.
USPTO Final Rejection for U.S. Appl. No. 09/658,597 dated Nov. 4, 2003; 8 pages.
USPTO Non-Final Rejection for U.S. Appl. No. 09/658,597 dated May 7, 2003; 7 pages.
USPTO Advisory Action for U.S. Appl. No. 09/658,597 dated Feb. 12, 2003; 3 pages.
USPTO Final Rejection for U.S. Appl. No. 09/658,597 dated Dec. 2, 2002; 12 pages.
USPTO Non-Final Rejection for U.S. Appl. No. 09/658,597 dated May 30, 2002; 11 pages.
U.S. Appl. No. 09/658,597: "Apparatus and Method to Test High Speed Devices with a Low Speed Tester," Larky et al.; 32 pages.
Catalyst Enterprises Inc., "SBAE-10" Bus Analyzer-Exerciser User's Manual (Jul. 3, 2000) and Analyser/Exerciser/Teser Specification Sheet (Mar. 21, 2000); 83 pages.
Free Online Dictionary of Computing, "host" and "emulation" <http://foldoc.doc.ic.ac.uk/foldoc/index.html>; 3 pages.
Free Online Dictionary of Computing, "DB-25" <http://foldoc.doc.ic.ac.uk/foldoc/index.html>; 1993; 1 page.
USB Info: Frequently Asked Questions <http://www.pasism.com/usbfaq.htm> 1995-2002; 3 pages.
Krstic et al., "Testing High Speed VLSI Device Using Slower Testers," VSLI Test Symposium, 1999, 17th IEEE Proceedings; 6 pages.
U.S. Appl. No. 09/658,894: "Apparatus and Method for Testing a Target Device," Larky et al.; 32 pages.
Lecroy, "CATC Advisory," <http://www.catc.com/products/advisor.html> 1998; 4 pages.
USPTO Miscellaneous Action for U.S. Appl. No. 09/658,894 dated Jun. 13, 2006; 16 pages.
USPTO Advisory Action for U.S. Appl. No. 09/658,894 dated Feb. 23, 2005; 3 pages.
USPTO Final Rejection for U.S. Appl. No. 09/658,894 dated Dec. 1, 2004; 20 pages.
USPTO Non-Final Rejection for U.S. Appl. No. 09/658,894 dated Jun. 15, 2004; 20 pages.
USPTO Advisory Action for U.S. Appl. No. 09/658,894 dated Mar. 17, 2004; 3 pages.
USPTO Final Rejection for U.S. Appl. No. 09/658,894 dated Dec. 31, 2003; 17 pages.
USPTO Non-Final Rejection for U.S. Appl. No. 09/658,894 dated Jul. 16, 2003; 9 pages.
USPTO Advisory Action for U.S. Appl. No. 09/658,894 dated Jan. 23, 2003; 3 pages.
USPTO Final Rejection for U.S. Appl. No. 09/658,894 dated Oct. 24, 2002; 10 pages.
USPTO Non-Final Rejection for U.S. Appl. No. 09/658,894 dated Jun. 5, 2002; 10 pages.
USPTO Miscellaneous Action for U.S. Appl. No. 09/658,894 date Dec. 27, 2005; 21 pages.
USPTO BPAI Decision (Examiner Affirmed in Part) for U.S. Appl. No. 09/658,894 dated Oct. 2, 2007; 22 pages.
USPTO Examiner's Answer to Appeal Brief for U.S. Appl. No. 09/658,894 dated Sep. 8, 2005; 36 pages.
USPTO Miscellaneous Action for U.S. Appl. No. 10/144,676 dated Dec. 3, 2004; 2 pages.
USPTO Notice of Allowance for U.S. Appl. No. 10/144,676 dated May 28, 2004; 7 pages.
USPTO Final Rejection for U.S. Appl. No. 10/144,676 dated Feb. 19, 2004; 13 pages.
USPTO Non-Final Rejection for U.S. Appl. No. 10/144,676 dated Jul. 10, 2003; 10 pages.
USPTO Notice of Allowance for U.S. Appl. No. 10/209,088 dated Mar. 8, 2004; 6 pages.
USPTO Final Rejection for U.S. Appl. No. 10/209,088 dated Dec. 30, 2003; 8 pages.
USPTO Non-Final Rejection for U.S. Appl. No. 10/209,088 dated Jul. 9, 2003; 5 pages.
USPTO Notice of Allowance for U.S. Appl. No. 10/784,566 dated May 23, 2006; 5 pages.
USPTO Non-Final Rejection for U.S. Appl. No. 10/784,566 dated Feb. 7, 2006; 5 pages.
USPTO Non-Final Rejection for U.S. Appl. No. 10/784,566 dated Aug. 22, 2005; 8 pages.
USPTO Non-Final Rejection for U.S. Appl. No. 10/784,566 dated Mar. 22, 2005; 8 pages.
Bengtsson et al., "Interface Charge Control of Directly Bonded Silicon Structures," Journal of Applied Physics, vol. 66, pp. 1231-1239; Aug. 1, 1989; 9 pages.
International Search Report of the International Searching Authority for International Application No. PCT/US03/14844 mailed Sep. 18, 2003; 3 pages.
USPTO Notice of Allowance for U.S. Appl. No. 09/208,889 dated Jul. 16, 2001; 2 pages.
USPTO Non-Final Rejection for U.S. Appl. No. 09/208,889 dated Mar. 2, 2001; 7 pages.
USPTO Advisory Action for U.S. Appl. No. 09/208,889 dated Jan. 17, 2001; 2 pages.
USPTO Final Rejection for U.S. Appl. No. 09/208,889 dated Oct. 24, 2000; 9 pages.
USPTO Non-Final Rejection for U.S. Appl. No. 09/208,889 dated Jun. 13, 2000; 7 pages.
USPTO Advisory Action for U.S. Appl. No. 09/208,889 dated Mar. 21, 2000; 2 pages.
USPTO Final Rejection for U.S. Appl. No. 09/208,889 dated Jan. 3, 2000; 7 pages.
USPTO Non-Final Rejection for U.S. Appl. No. 09/208,889 dated Aug. 3, 1999; 7 pages.
USPTO Notice of Allowance for U.S. Appl. No. 08/561,886 dated Oct. 8, 1998; 1 page.
USPTO Final Rejection for U.S. Appl. No. 08/561,886 dated Jul. 16, 1998; 6 pages.
USPTO Non-Final Rejection for U.S. Appl. No. 08/561,886 dated Jan. 29, 1998; 5 pages.
USPTO Non-Final Rejection for U.S. Appl. No. 08/561,886 dated Mar. 19, 1997; 5 pages.
USPTO Notice of Allowance for U.S. Appl. No. 08/839,981 dated Nov. 9, 1999; 3 pages.
USPTO Non-Final Rejection for U.S. Appl. No. 08/839,981 dated Jun. 9, 1999; 7 pages.
USPTO Non-Final Rejection for U.S. Appl. No. 08/839,981 dated Nov. 4, 1998; 7 pages.
USPTO Non-Final Rejection for U.S. Appl. No. 08/839,981 dated May 28, 1998; 10 pages.
International Search Report of the International Searching Authority for International Application No. PCT/US97/04032 mailed Jul. 11, 1997; 3 pages.
USPTO Notice of Allowance for U.S. Appl. No. 08/705,807 dated Jun. 30, 1998; 3 pages.
USPTO Non-Final Rejection for U.S. Appl. No. 08/705,807 dated Nov. 26, 1997; 4 pages.
USPTO Notice of Allowance for U.S. Appl. No. 09/481,038 dated Oct. 22, 2001; 2 pages.
USPTO Non-Final Rejection for U.S. Appl. No. 09/481,038 dated May 22, 2001; 7 pages.
USPTO Advisory Action for U.S. Appl. No. 09/481,038 dated Dec. 7, 2000; 2 pages.
USPTO Final Rejection for U.S. Appl. No. 09/481,038 dated Aug. 29, 2000; 4 pages.

* cited by examiner

INTERFACE APPARATUS AND METHODS OF TESTING INTEGRATED CIRCUITS USING THE SAME

CROSS-REFERENCE TO RELATED APPLICATIONS

The present application claims the benefit of priority under 35 U.S.C. 119(e) to U.S. Provisional Patent Application Ser. No. 60/777,584 filed Feb. 28, 2006, entitled Smart Load board And Probe card And Methods Of Testing Semiconductor Wafers And Integrated Circuits Using The Same; which application is hereby incorporated by reference.

TECHNICAL FIELD

The present invention relates generally to semiconductor fabrication, and more particularly to apparatus and methods for testing devices on semiconductor wafers and integrated circuits using the same.

BACKGROUND OF THE INVENTION

Manufacturers in the electronic industry use test systems to automatically test various electronic components and integrated circuits (ICs) to weed out defective devices or ICs. Generally, it is desirable to test the ICs at several points during the manufacturing process including while they are still part of a wafer or substrate and after packaging the devices before they are mounted or assembled on modules, cards or boards.

Conventional methods for testing devices in the front end (FE), that is before assembly and packaging, are commonly referred to as FE tests and use a low-end, slow tester and a probe card to electrically couple to devices under test (DUTs) in an undiced wafer. Although this approach has the advantages of using a relatively inexpensive tester and of weeding out defective devices prior to incurring the expense of assembly and packaging, it is limited in that these testers can only perform functional tests at low speed and parametric tests.

Because of the limitations of conventional FE testing, it is generally necessary to perform additional back end (BE) tests following assembly and packaging using an expensive, fast high-end tester. These high-end testers, commonly referred to as "big iron" testers, are capable of performing both high speed functional tests and parametric tests. For example, full speed datasheet tests are typically performed in the back end on Big Iron testers.

Conventional BE testing methods have not been wholly satisfactory for a number of reasons. First, the trend in the electronic industry has been to further increase the miniaturization of electronic devices and circuits, thereby leading to an increase in the complexity of the ICs tested. Thus, as ICs become more complex, the complexity and cost of these Big Iron back end testers has increased correspondingly. Moreover, because BE testing is performed only after assembly and packaging, money is wasted on packing "bad" devices, significantly reducing the cost efficiency of the manufacturing process. Attempts have been made at reducing the money wasted on packing defective devices by moving speed tests from the back end to the front end by testing at the wafer level, that is while the devices or ICs are still part of an undiced wafer, using slow, inexpensive testers with an "offset" introduced to compensate for the difference in speed. However, this approach results in the culling of "good" devices at wafer level, leading to yield overkill and again reduces the cost efficiency of the manufacturing process. Moreover, due to setup and hold times on faster synchronous devices even this technique cannot enable full speed datasheet testing using the slower, inexpensive testers typically used in the front end.

Accordingly, there is a need for an apparatus and method for high-speed testing of devices and ICs at the wafer level in the front end. There is a further need for an apparatus and method that enables high-speed, datasheet testing of assembled and packaged devices and ICs in the back end, which eliminates the need for complex and expensive testers.

The present invention provides a solution to these and other problems, and offers further advantages over conventional testing apparatus and methods.

BRIEF DESCRIPTION OF THE DRAWINGS

These and various other features and advantages of the present invention will be apparent upon reading of the following detailed description in conjunction with the accompanying drawings and the appended claims provided below, where:

DETAILED DESCRIPTION

Figure 1:
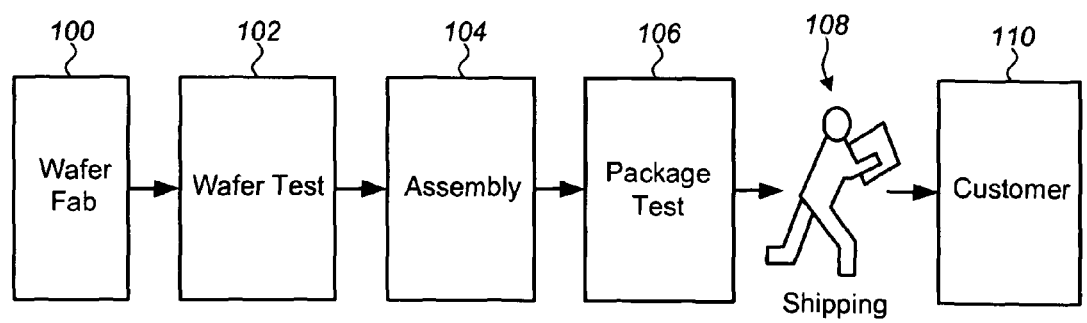
FIG. 1 is a process flow of a method for testing wafers and integrated circuits (ICs) using a test set-up according to an embodiment of the present invention.

The following description is directed to apparatus and methods for testing devices on semiconductor wafers and integrated circuits (ICs), and more particularly to advanced probe cards and load boards and to methods of front end (FE) and back end (BE) testing of a device under test (DUT) using the same.

In the following description, for purposes of explanation, numerous specific details are set forth in order to provide a thorough understanding of the present invention. It will be evident, however, to one skilled in the art that the present invention may be practiced without these specific details. In other instances, well-known structures, and techniques are not shown in detail or are shown in block diagram form in order to avoid unnecessarily obscuring an understanding of this description.

Reference in the description to "one embodiment" or "an embodiment" means that a particular feature, structure, or characteristic described in connection with the embodiment is included in at least one embodiment of the invention. The appearances of the phrase "in one embodiment" in various places in the specification do not necessarily all refer to the same embodiment. The term "to couple" as used herein may include both to directly connect and to indirectly connect through one or more intervening components.

By DUT it is meant any electronic component module or an IC having logic circuits, memory arrays or both. DUT can be one of a number of die or devices on an undiced substrate, an individual die or device, or a packaged device. A DUT can be coupled to test apparatus via a number of pins or via probes contacting pads on the die.

Broadly, there are two types of test systems or apparatus, those suitable for testing memory arrays or circuits, such as flash memory or Random Access Memories (RAM), and those suitable for testing logic circuits, such as Micro Controllers, Application Specific ICs (ASICs), and Programmable Logic Devices (PLDs). Often devices or DUTs include both memory arrays and logic circuits. Moreover, it is generally desirable to test the ICs at several points during the manufacturing process including while they are still part of a wafer or substrate and after packaging the devices before they are mounted or assembled on modules, cards or boards.

Preferably, the test system and method of the present invention are capable of testing ICs while they are still part of a wafer in the front end and after packaging in the back end. More preferably, the test system and method of the present invention are capable of DUTs including memory arrays or circuits, logic circuits or both.

Briefly, the test system or apparatus of the present invention includes an interface board coupled to a number of test circuits and having a number conductive elements adapted to electrically couple with electrical terminals on the DUT. Each test circuit resides on one of a number of daughter cards physically and electrically connected to the interface board, and can include a combination of memory chips, clock chips, level drivers, and comparators. In a preferred embodiment, the daughter card is implemented using a programmable logic circuit, such as a Field Programmable Gate Array (FPGA). Each test circuit is arranged to provide test input signals to and receive output signals from the DUT through the interface board to generate a test result based on a program loaded to an FPGA on a daughter card before testing begins, and which then executes the code. Generally, the test system further includes a controller to drive the interface board and store test results outputted from the test circuits.

In one embodiment, the controller is a Personal Computer (PC) or a Low-Cost-Tester (LCT), and the program is loaded directly from the PC or LCT to the FPGA before testing begins. The FPGA then executes the code to test the DUTs. This embodiment is particularly useful for lot test, a test or series of tests performed at the wafer level, that is on undiced wafers or substrates, to cull out defective dies in a process commonly referred to as die purification, thereby saving packaging costs and improving back end yield.

Alternatively, the daughter cards can further include a memory to store a program, which is loaded to the FPGA on the daughter card before testing begins. This embodiment is particularly advantageous when a large amount of memory is needed, as in the case where extremely complex testing is required.

The test system and method of the present invention will now be described in greater detail with reference to FIGS. 1 to 5.

FIG. 1 shows a process flow for testing ICs according to the present invention. Referring to FIG. 1 following fabrication, the process or test method generally begins when finished die are moved from the wafer fabrication laboratory or fab 100 to wafer test 102, in which DUTs in die on an uncut wafer or substrate are tested, FE testing, either simultaneously or sequentially. Results of these FE tests are used to cull out defective dies in a process commonly referred to as die purification, thereby saving packaging costs and improving back end yield. Optionally, the test results can be used to identify bin1 or bin 2 materials etc at the wafer level in a process commonly known as Speed Binning.

Following wafer test 102 passing dies are assembled or bonded to electrical connections or pins of a lead frame or a package substrate (in the case of Ball grid arrays), and packaged in a process commonly referred to as assembly 104. Next, following assembly, the packaged DUTs are tested subjected to high-speed functional and speed BE tests in a in a process commonly referred to as package test 106. The packaged DUTs are subjected to high-speed functional and speed BE tests in a in a process commonly referred to as package test. As noted above, such BE tests were conventionally performed using expensive "big iron" testers. However, in accordance with the present invention, the BE tests are performed using an advanced or smart load board having a number of daughter cards with test circuits implemented using one or more FPGAs.

The fully tested device is then shipped 108 to an internal or external customer 110.

In one aspect or embodiment, the interface board is an advanced or smart probe card adapted for performing FE tests on the wafer, including functional and speed testing. For purposes of clarity, many of the details of semiconductor testing in general, and probe cards in particular that are widely known and are not relevant to the present invention have been omitted from the following description. Semiconductor testing and probe cards are also disclosed in commonly assigned U.S. Pat. Nos. 6,847,218, 6,759,865, and 7,112,975, which are incorporated herein by reference in their entirety.

Figure 2:
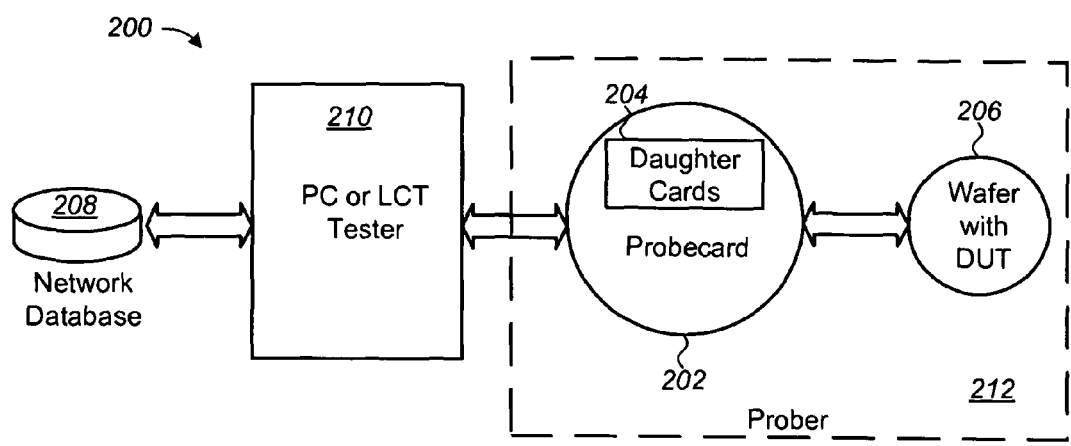
FIG. 2 is a functional block diagram of a test set-up using an advanced or smart probe card having a number of Field Programmable Gate Array (FPGA) daughter cards according to an embodiment of the present invention to test a device under test (DUT) on a semiconductor wafer.

A functional block diagram of a test set-up or system 200 using an advanced or smart probe card 202 having a number of daughter cards 204 each with a number of FPGAs to test a DUT in a die on a semiconductor wafer 206 is shown in FIG. 2. Referring to FIG. 2, datasheet specification or parameters are provided from a network database 208 to a test system controller 210, such as a PC or a LCT, to drive or control the probe card 202 and a prober 212 in which the probe card 202 is installed. The probe card 202 includes multiple probes (not shown) to align with and contact electrical pads of the DUT(s) on the wafer 206, and a number of test circuits (not shown in this figure), each resident on or implemented using one or more of the FPGAs on the daughter cards 204. The test circuits on the daughter cards 204 are adapted to provide test input signals to the DUT(s), and to receive output signals therefrom to generate a test result based on a program loaded directly from the controller 210 before testing begins. The FPGAs on the daughter cards 204 then execute the program code to test the DUTs, and the test results are transferred to and stored in the controller 210. Optionally, the test results can be transferred through the controller 210 to the network database 208.

Alternatively, the daughter cards 204 could further include a memory (not shown) to store a program, which is then loaded to an FPGA on the daughter card before testing begins. This embodiment is particularly advantageous when a large amount of memory is needed, as in the case of extremely complex testing is required.

The program can provide test signals or vectors including vectors from a Logic Vector Memory (LVM) for testing logic circuits, and vectors generated by an algorithmic pattern generator (APG) for testing memory arrays. The test system 200 with the probe card 202 of the present invention is capable of testing DUTs including memory arrays, logic circuits or both at speeds of up to that of the FPGAs of the daughter cards 204. Preferably, the probe card 202 is capable of testing DUTs at speeds of up to about 333 MHz, and more preferably, up to about 500 MHz. Most preferably, the FPGA on the daughter cards 204 are capable of being re-programmed and re-used with a number of different interface boards or probe cards 202 to test a number of different DUTs.

Figure 3:
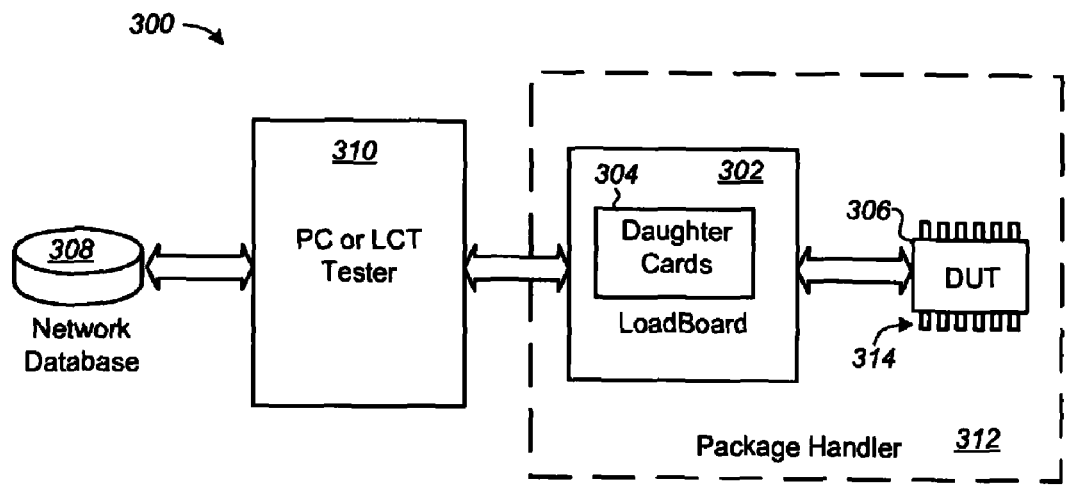
FIG. 3 is a functional block diagram of a test set-up using an advanced or smart load board having a number of FPGA daughter cards according to another embodiment of the present invention to test a DUT.

In another aspect or embodiment of the present invention the interface board is an advanced or smart load board adapted for performing BE tests on the DUT(s). A functional block diagram of a test set-up or system 300 using an advanced or smart load board 302 having a number of daughter cards 304 each with a number of FPGAs to test a packaged DUT 306 is shown in FIG. 3. Referring to FIG. 3, datasheet specification or parameters are provided from a network database 308 to a test system controller 310, s such as a PC or a LCT, to drive or control the load board 302 and a package handler 312 in which the load board is installed. The load board 302 includes a number of conductive elements (not shown) to electrically couple with electrical terminals or connectors, such as pins 314, coming out of the packaged DUT 306. As in the probe card embodiment described above, the load board 302 further includes a number of test circuits (not shown in this figure), each resident on or implemented using one or more of the FPGAs on the daughter cards 304, and each adapted to provide test input signals to the DUT(s) and to receive output signals therefrom to generate a test result based on a program loaded to the FPGA before testing begins. The FPGAs on the daughter cards 304 then execute the program code to test the DUTs, and the test results are transferred to and stored in the controller 310. Optionally, the test results can be transferred through the controller 310 to the network database 308.

Also as described above, the daughter cards 304 could further include a memory (not shown) to store a program, which is then loaded to an FPGA on the daughter card before testing begins. This embodiment is particularly advantageous when a large amount of memory is needed, as in the case of extremely complex testing is required.

Preferably, the load board 302 is capable of testing DUTs at speeds of up to about 333 MHz, and more preferably, up to about 500 MHz. Most preferably, the daughter cards 304 are capable of being re-programmed and re-used with a number of different interface boards or load boards 302 to test a number of different DUTs 306.

Figure 4:
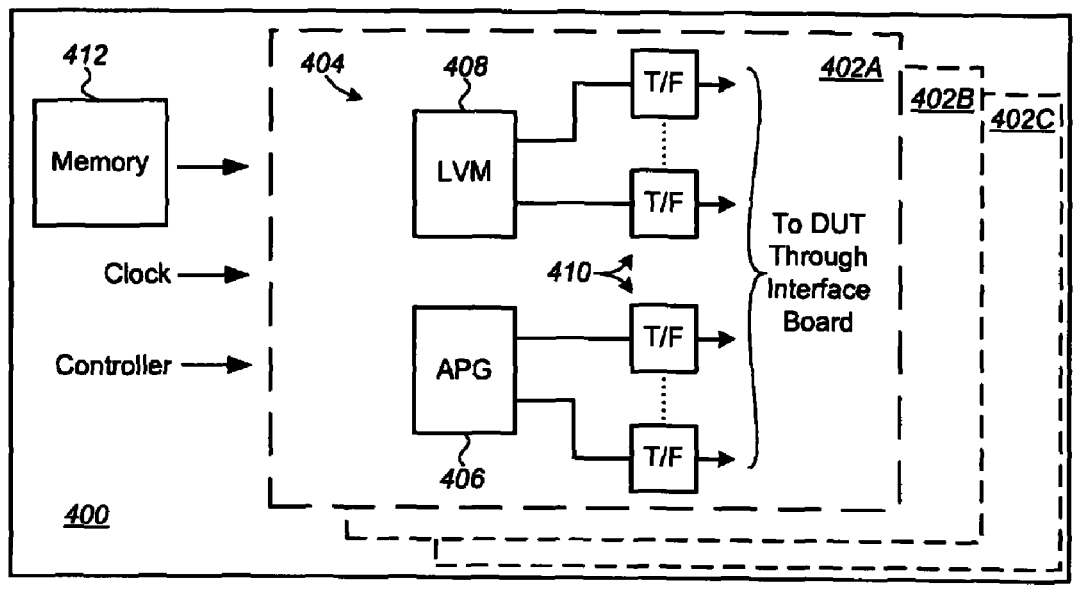
FIG. 4 is a functional block diagram of an FPGA daughter card having a number of test circuits according to an embodiment of the present invention.

A functional block diagram of an FPGA daughter card having a number of test circuits according to an embodiment of the present invention is shown in FIG. 4. Referring to FIG. 4, the daughter card 400 generally includes one or more FPGAs 402A-C on which is resident or implemented one or more test circuits 404. Generally, each test circuit 404 has a number of functional blocks or sub-circuits including an APG 406 for executing algorithms and generating patterns for testing DUTs including memory circuits or arrays, an LVM 408 for providing logic test vectors for testing DUTs including logic circuits, and multiple timing and formatting circuits (T/F 410) to adjust the timing and formatting of signals received from the LVM and the APG, and to couple the LVM and the APG to the DUT. Each test circuit 404 is coupled through the interface card, i.e., the probe card or the load board, to the controller (not shown in this figure) to receive a program before testing begins. The program can include test parameters or device specifications as well as a test algorithm or vector. In addition, each test circuit 404 may receive a clock input or signal from the controller or from a separate clock (not shown) located on the daughter card 400. Optionally, the daughter card 400 could further include a memory 412, such as a flash memory, to store more complex test vectors or programs loaded from the controller before testing begins. The memory 412 can also be used to store test results prior to transferring them to the controller.

Figure 5:
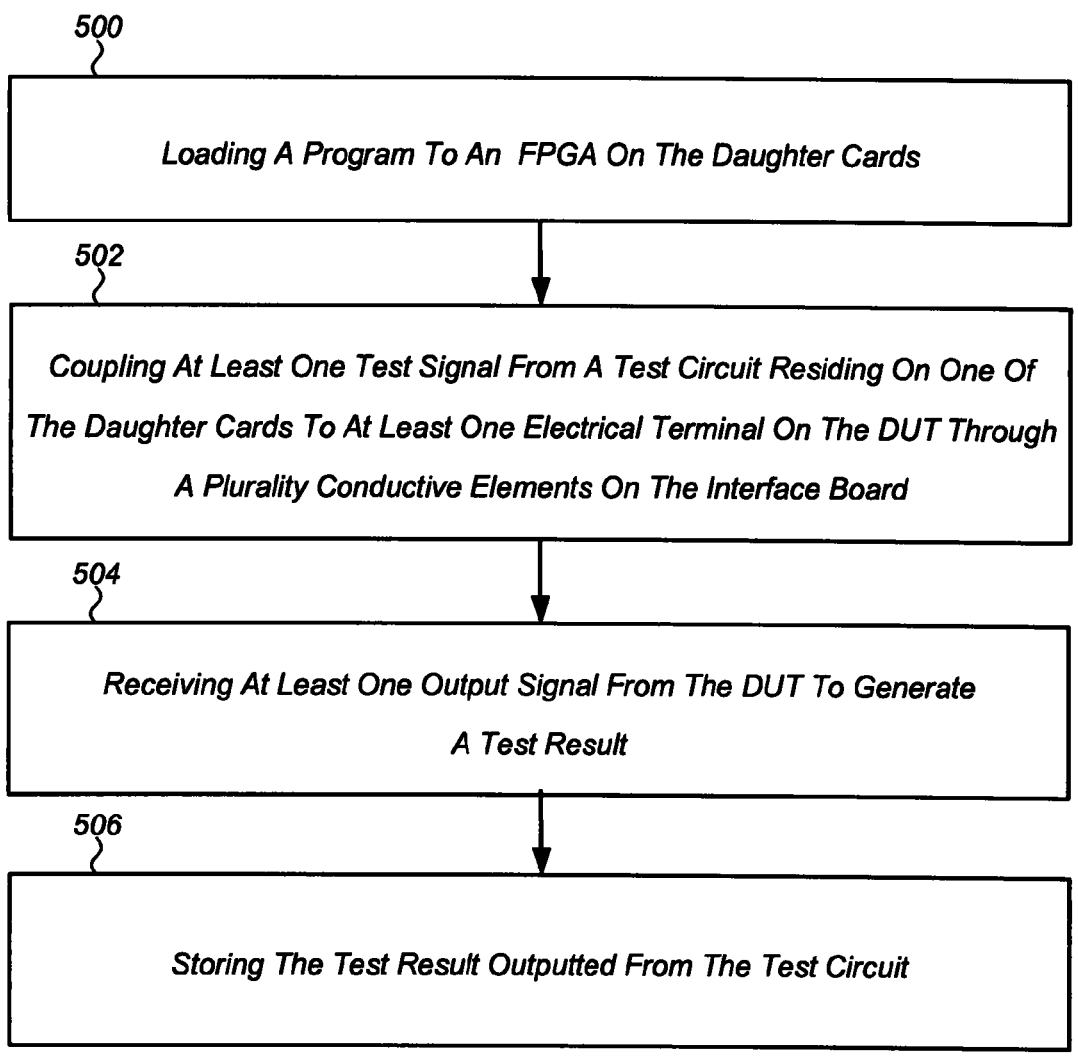
FIG. 5 is flow chart of a method for testing a DUT using a test apparatus including an interface board with a number of FPGA daughter cards according to an embodiment of the present invention.

Methods for testing a DUT using a test apparatus including an interface board with a number of daughter cards in accordance with the present invention will now be described in greater detail with reference to the flowchart of FIG. 5. Referring to FIG. 5, generally the method of the present invention begins with loading a program to an FPGA on the daughter cards (step 500). Next, at least one test signal from a test circuit residing on one of the daughter cards is coupled to at least one electrical terminal on the DUT through multiple conductive elements on the interface board (step 502). Following this, at least one output signal from the DUT is received in by the test circuit to generate a test result (step 504). Finally, the test result outputted from the test circuit is stored in the controller or uploaded to the network database (step 506).

The advantages of the over previous or conventional methods include: (i) cost reduction—uses a computer or LCT to drive handler and smart load board and/or prober and smart probe card; (ii) FPGA based daughter cards are re-useable on multiple products or DUT types; (iii) enables inexpensive testing at class test in back end, thereby reducing the need for expensive "big iron" testers; (iv) capable of testing DUTs including memory arrays or circuits, logic circuits or both; (v) capable of testing DUTs or products at low and high speeds up to about 500 Mhz; and (vi) with in-house speed test speed failures are caught at wafer level, saving packaging costs and providing faster feedback to fab engineers, thereby improving yield.

The foregoing description of specific embodiments and examples of the invention have been presented for the purpose of illustration and description, and although the invention has been described and illustrated by certain of the preceding examples, it is not to be construed as being limited thereby. They are not intended to be exhaustive or to limit the invention to the precise forms disclosed, and many modifications, improvements and variations within the scope of the invention are possible in light of the above teaching. It is intended that the scope of the invention encompass the generic area as herein disclosed, and by the claims appended hereto and their equivalents. The scope of the present invention is defined by the claims, which includes known equivalents and unforeseeable equivalents at the time of filing of this application.

What is claimed is:

1. An apparatus for performing electrical tests on at least one device under test (DUT), the apparatus comprising
    an interface board provided with a plurality conductive elements adapted to electrically couple with electrical terminals on the DUT and connected to a number of test circuits, each of said test circuits residing on one of a plurality of Field Programmable Gate Array (FPGA) daughter cards on said interface board, and arranged to provide test input signals to said DUT and receive output signals from said DUT to generate a test result based on a program loaded to the FPGA daughter cards before testing begins;
    a controller to control said interface board and store therein said test result outputted from said test circuit; and
    wherein each of the plurality of FPGA daughter cards include a plurality of FPGAs, and a memory to store the test results, and at least one of the plurality of FPGAs include a logic vector memory (LVM) to test logic circuits in the DUT.

2. An apparatus according to claim 1, wherein the interface board is a load-board, and wherein the plurality conductive elements comprise sockets to receive pins out of a packaged DUT.

3. An apparatus according to claim 1, wherein the interface board is a probe card, and wherein the plurality conductive elements comprise probes to align with and contact electrical pads of the DUT in a die in a semiconductor wafer.

4. An apparatus according to claim 1, wherein the controller comprises a Personal Computer (PC) or a Low-Cost-Tester (LCT).

5. An apparatus according to claim 4, wherein a program is loaded to the memory of at least one of the plurality of FPGA daughter cards before testing begins.

6. An apparatus according to claim 5, wherein the program is loaded directly from the PC or LCT to the memory before testing begins.

7. A method for testing a device under test (DUT) using an apparatus including an interface board with a plurality of Field Programmable Gate Array (FPGA) daughter cards physically and electrically connected thereto, the method comprising:
  loading a program to a memory on at least one of the plurality of FPGA daughter cards;
  configuring at least one of a number of FPGAs on at least one of the plurality of FPGA daughter cards with the program loaded in the memory before testing begins;
  transmitting at least one test signal from a test circuit residing on one of the FPGA daughter cards to at least one electrical terminal on the DUT through a plurality conductive elements on the interface board;
  receiving at least one output signal from the DUT to generate a test result; and
  storing the test result in the memory.

8. A method according to claim 7, wherein the apparatus comprises a controller to control the interface board.

9. A method according to claim 8, wherein the controller comprises a Personal Computer (PC) or a Low-Cost-Tester (LCT).

10. A method according to claim 7, wherein the interface board is a load-board, and wherein the plurality of conductive elements on the interface board comprise sockets to receive pins out of a packaged DUT.

11. A method according to claim 7, wherein the interface board is a probe card, and wherein the plurality conductive elements on the interface board comprise probes to align with and contact electrical pads of the DUT in a die in a semiconductor wafer.

12. A system comprising:
  an interface board including a plurality of conductive elements adapted to electrically couple with terminals on a device under test (DUT); and
  a number of Field Programmable Gate Array (FPGA) daughter cards electrically connected to the plurality conductive elements, each of said FPGA daughter cards including a number of FPGAs configured to provide test input signals to terminals on the DUT through the plurality conductive elements and to receive output signals therefrom to generate a test result based on a program loaded to the FPGA daughter cards before testing begins, and a memory electrically connected to the number of FPGAs to store the test results, wherein at least one of the number of FPGAs include a logic vector memory (LVM) to test logic circuits in the DUT.

13. A system according to claim 12, wherein at least one of the number of FPGAs further include an algorithmic pattern generator (APG) to test memory arrays in the DUT.

14. A system according to claim 12, further including a controller electrically coupled to the number of FPGA daughter cards to control the number of FPGAs.

15. A system according to claim 14, wherein the controller is further electrically coupled to the memory to receive from the memory the test results stored therein.

16. A system according to claim 14, wherein the memory is electrically coupled to the controller to store programs from the controller, and is configured to program the number of FPGAs.

17. A system according to claim 15, wherein the memory is configured to store test vectors used to test logic circuits in the DUT.

18. A system according to claim 12, wherein the interface board is a load-board, and wherein the plurality conductive elements comprise sockets to receive pins out of a packaged DUT.

19. A system according to claim 12, wherein the interface board is a probe card, and wherein the plurality conductive elements comprise probes to align with and contact electrical pads of the DUT in a die in a semiconductor wafer.

* * * * *